US007649398B2

(12) United States Patent
Park et al.

(10) Patent No.: US 7,649,398 B2
(45) Date of Patent: Jan. 19, 2010

(54) LEVEL SHIFTER WITH SINGLE INPUT AND LIQUID CRYSTAL DISPLAY DEVICE USING THE SAME

(75) Inventors: Kee-chan Park, Suwon-si (KR); Il-gon Kim, Seoul (KR); Kook-chul Moon, Yongin-si (KR); Tae-hyeong Park, Yongin-si (KR); Chul-ho Kim, Seoul (KR); Cheol-min Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 654 days.

(21) Appl. No.: 11/185,283

(22) Filed: Jul. 20, 2005

(65) Prior Publication Data

US 2007/0018931 A1 Jan. 25, 2007

(51) Int. Cl.
*H03L 5/00* (2006.01)

(52) U.S. Cl. ............................ 327/333; 326/68; 326/81

(58) Field of Classification Search ................. 327/333; 326/68, 80, 81; 365/189.11
See application file for complete search history.

(56) References Cited

U.S. PATENT DOCUMENTS 4,713,600 A 12/1987 Tsugaru et al.
5,646,642 A * 7/1997 Maekawa et al. ........... 327/333
5,748,026 A * 5/1998 Maekawa et al. ........... 327/333
6,081,131 A * 6/2000 Ishii ............................ 326/68
6,404,230 B1 6/2002 Cairns et al.
6,731,273 B2 * 5/2004 Koyama et al. ............. 327/333

FOREIGN PATENT DOCUMENTS

KR 20030051920 6/2003

* cited by examiner

*Primary Examiner*—Long Nguyen
(74) *Attorney, Agent, or Firm*—Cantor Colburn LLP

(57) ABSTRACT

A single input level shifter, which performs a stable level-shifting operation without increasing its area when used with a thin film transistor ("TFT") having a variety of different characteristics, and includes an intermediate voltage signal providing unit for providing an intermediate voltage signal having a voltage between a supply voltage and an input signal voltage, an inverting unit for receiving the intermediate voltage signal and providing an inverted intermediate voltage signal, and a voltage signal comparing unit for comparing the intermediate voltage signal with the inverted intermediate voltage signal and providing the supply voltage or the ground voltage according to the comparison. A TFT liquid crystal display ("LCD") device employs the single input level shifter.

11 Claims, 4 Drawing Sheets

LEVEL SHIFTER WITH SINGLE INPUT AND LIQUID CRYSTAL DISPLAY DEVICE USING THE SAME

BACKGROUND OF THE INVENTION

1. Field of the Invention

The present invention relates to a single input level shifter and a thin film transistor ("TFT") liquid crystal display ("LCD") device using the same, and more particularly, to a single input level shifter that can perform a stable level-shifting operation without increasing its area when used with TFTs having a variety of different characteristics, and a TFT LCD device using the same.

2. Description of the Related Art

As personal computers and television sets get smaller, lighter, and thinner, the demand for smaller, lighter, and thinner display devices increases. In order to meet this demand, flat panel display devices such as liquid crystal display ("LCD") devices have been developed to replace cathode ray tubes ("CRT").

LCD devices are display devices that apply an electric field to a liquid crystal material injected between two substrates and having an anisotropic dielectric constant. LCD devices also adjust the intensity of the electric field and adjust the amount of light transmitted onto the substrates, thereby generating a desired image signal. Examples of common LCD devices include portable flat panel display devices, and thin film transistor ("TFT") LCD devices that use TFTs as switching elements.

In general, a TFT LCD device includes a display unit having a plurality of gate lines that transmit a scan signal, a plurality of data lines that transmit gray-scale voltages in response to an image data signal, where the plurality of data lines are isolated from and cross the plurality of gate lines, and a plurality of pixels arranged in a matrix and having switching elements connected between the plurality of gate lines and the plurality of data lines. The TFT LCD further includes a gate driving unit that provides the scan signal to the gate lines, a data driving unit that provides the gray-scale voltages to the data lines, a timing control unit that provides a logic signal, and a level shifter that level-shifts the logic signal and transmits the level-shifted logic signal to the gate driving unit or the data driving unit.

Here, the level shifter receives a digital logic signal from the external timing control unit and amplifies the signal so as to drive the gate driving unit or the data driving unit.

A conventional level shifter for an LCD device will now be described with reference to FIG. 1. The level shifter includes metal oxide semiconductor ("MOS") transistors made of layers of silicon, an insulting oxide layer, and a metal gate. An MOS transistor is a voltage-controlled switch that has three connection points including a source, a drain, and a gate. A p-channel type, or PMOS transistor for short, and an n-channel type, or NMOS transistor for short, are made from materials with different affinities for electrons. Conduction for the PMOS transistor is based on holes, and conduction for the NMOS transistor is based on electrons.

In a case where an input signal IN input to the level shifter of FIG. 1 is low, a PMOS transistor MP5 is turned on and an inverted signal INB of the input signal IN, i.e., a high level, is applied to a PMOS transistor MP2 and an NMOS transistor MN2. As a result, the PMOS transistor MP2 is turned off, the NMOS transistor MN2 is turned on, and a ground voltage is provided as an output signal OUT. On the other hand, when the input signal IN is high, an NMOS transistor MN3 is turned on, and the inverted signal INB applied to the PMOS transistor MP2 and the NMOS transistor MN2 is low. As a result, the PMOS transistor MP2 is turned on, the NMOS transistor MN2 is turned off, and, in an ideal situation, a supply voltage is provided as an output signal OUT. Thus, the level shifter provides a voltage signal, i.e., the supply voltage, which has a larger voltage than the input signal.

However, the level shifter of FIG. 1 comprises a plurality of TFTs that can perform a stable level-shifting operation only when the size of the high-level voltage of the input signal is equal to or greater than a predetermined voltage. Due to a high threshold voltage, a low field effect mobility μ, or large sub-threshold swing, the TFTs operate stably only at voltages above the threshold voltage. Thus, when the voltage level of the input signal is equal to or less than the threshold voltage, an NMOS transistor is not sufficiently turned on and cannot invert the input signal. When the input signal cannot be inverted, the output signal OUT of the level shifter is maintained at a high level or a low level, but the voltage level of the output signal OUT is less than that of the supply voltage. In addition, the level-shifting operation may vary depending on the field effect mobility or subthreshold swing, and the deviation of the threshold voltage.

In U.S. Pat. No. 6,404,230, a level shifter for an LCD device is disclosed that level-shifts an input signal by separately applying the input signal and an inverted signal of the input signal. However, since an interconnection for transmitting the input signal and an interconnection for transmitting the inverted signal of the input signal are required, the area of the level shifter increases, and the number of output terminals of a timing control unit increases.

In Korean Patent Laid-open Publication No. 2003-0051920, a level shifter for an LCD device is disclosed that level-shifts an input signal by separately applying an input signal and a reference voltage. However, since an interconnection for transmitting a reference voltage is coupled with an interconnection for transmitting other voltage signals, and a stable reference voltage cannot be transmitted, malfunctions may occur.

BRIEF SUMMARY OF THE INVENTION

The present invention provides a single input level shifter, which can perform a stable operation without increasing its area even when used with TFTs having a variety of different characteristics.

The present invention also provides a liquid crystal display ("LCD") device using the single input level shifter.

According to one exemplary embodiment of the present invention, there is provided a single input level shifter, the single input level shifter including an intermediate voltage signal providing unit providing an intermediate voltage signal having a voltage between a supply voltage and an input signal voltage, an inverting unit receiving the intermediate voltage signal and providing an inverted intermediate voltage signal, and a voltage signal comparing unit comparing the intermediate voltage signal with the inverted intermediate voltage signal and providing the supply voltage or the ground voltage according to comparison between the intermediate voltage signal and the inverted intermediate voltage signal.

According to another exemplary embodiment of the present invention, there is provided a liquid crystal display device including a display unit including a plurality of gate lines that transmit a scan signal, a plurality of data lines that transmit a gray-scale voltage in response to an image data signal and that are isolated from the plurality of gate lines, wherein the gate lines cross the data lines, and a plurality of pixels that are arranged in a matrix having switching elements connected between the plurality of gate lines and the plurality of data lines, a gate driving unit for providing the scan signal to the gate lines, a data driving unit for providing the gray-scale voltage to the data lines; timing control unit for providing a logic signal, and a single input level shifter level-shifting the logic signal and transmitting level-shifted logic signal to the gate driving unit or the data driving unit, the single input level shifter including an intermediate voltage signal providing unit providing an intermediate voltage signal having a voltage between a supply voltage and an input signal voltage, an inverting unit receiving the intermediate voltage signal and providing an inverted intermediate voltage signal, and a voltage signal comparing unit comparing the voltage of the intermediate voltage signal with the inverted intermediate voltage signal and providing the supply voltage or ground voltage according to comparison between the intermediate voltage signal and the inverted intermediate voltage signal.

According to another exemplary embodiment of the present invention, a single input level shifter includes an intermediate voltage signal providing unit providing an intermediate voltage signal to an inverting unit, the intermediate voltage signal including one of a first intermediate voltage signal corresponding to a first input signal and a second intermediate voltage signal corresponding to a second input signal, a voltage of the first intermediate voltage signal larger than a voltage of the second intermediate voltage signal, and the voltage of the first intermediate voltage signal larger than a voltage of the first input signal.

According to another exemplary embodiment of the present invention, a single input level shifter includes an intermediate voltage signal providing unit providing an intermediate voltage signal, an inverting unit including an NMOS transistor having a threshold voltage, and when the threshold voltage is larger than a voltage of an input signal but smaller than a voltage of the intermediate voltage signal, the NMOS transistor is turned on.

The above stated embodiments as well as other objects, features, embodiments, and advantages of the present invention will become clear to those skilled in the art upon review of the following description.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
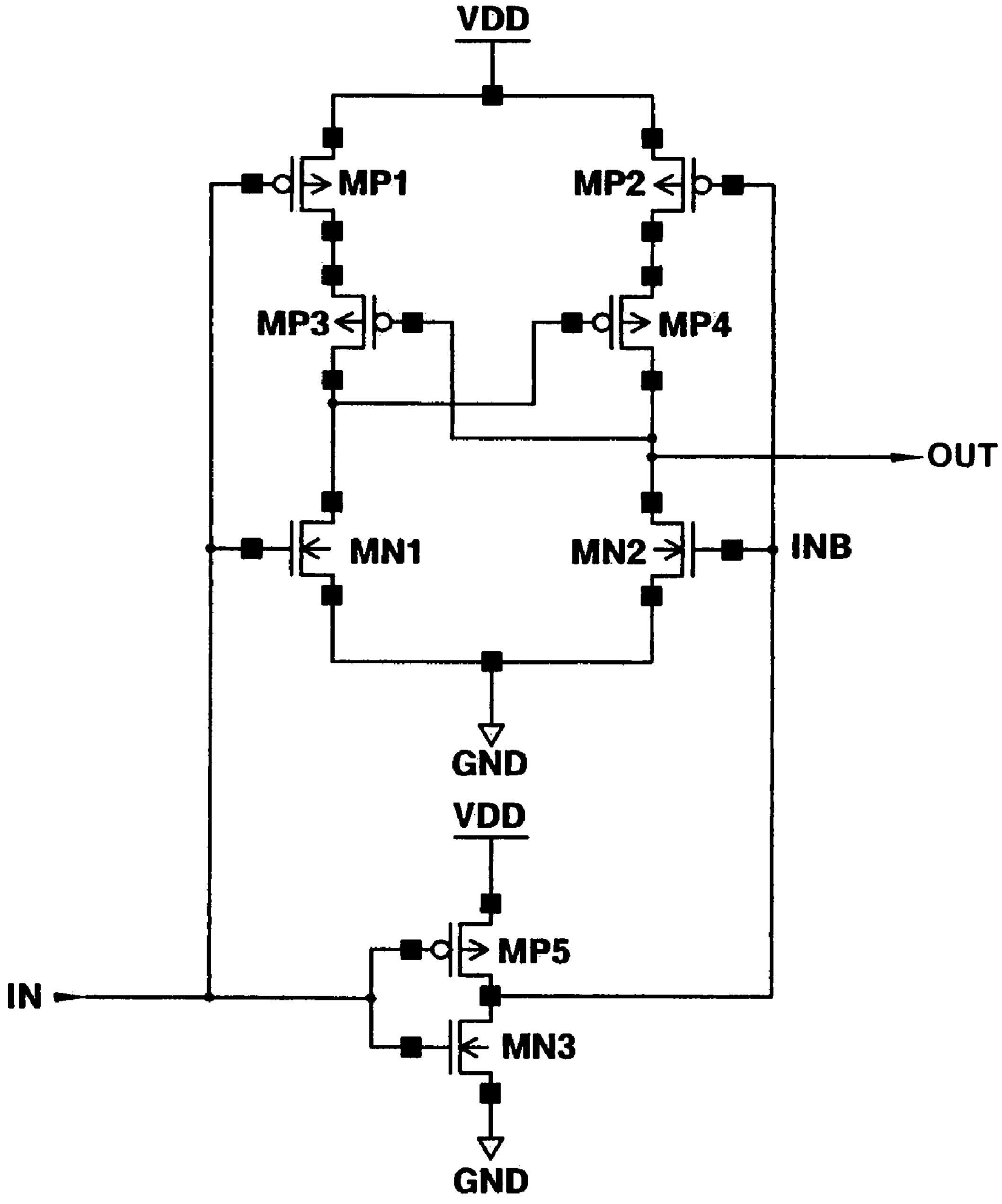
FIG. 1 (PRIOR ART)
FIG. 1 is a circuit diagram of a conventional level shifter for a liquid crystal display ("LCD") device.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Figure 2:
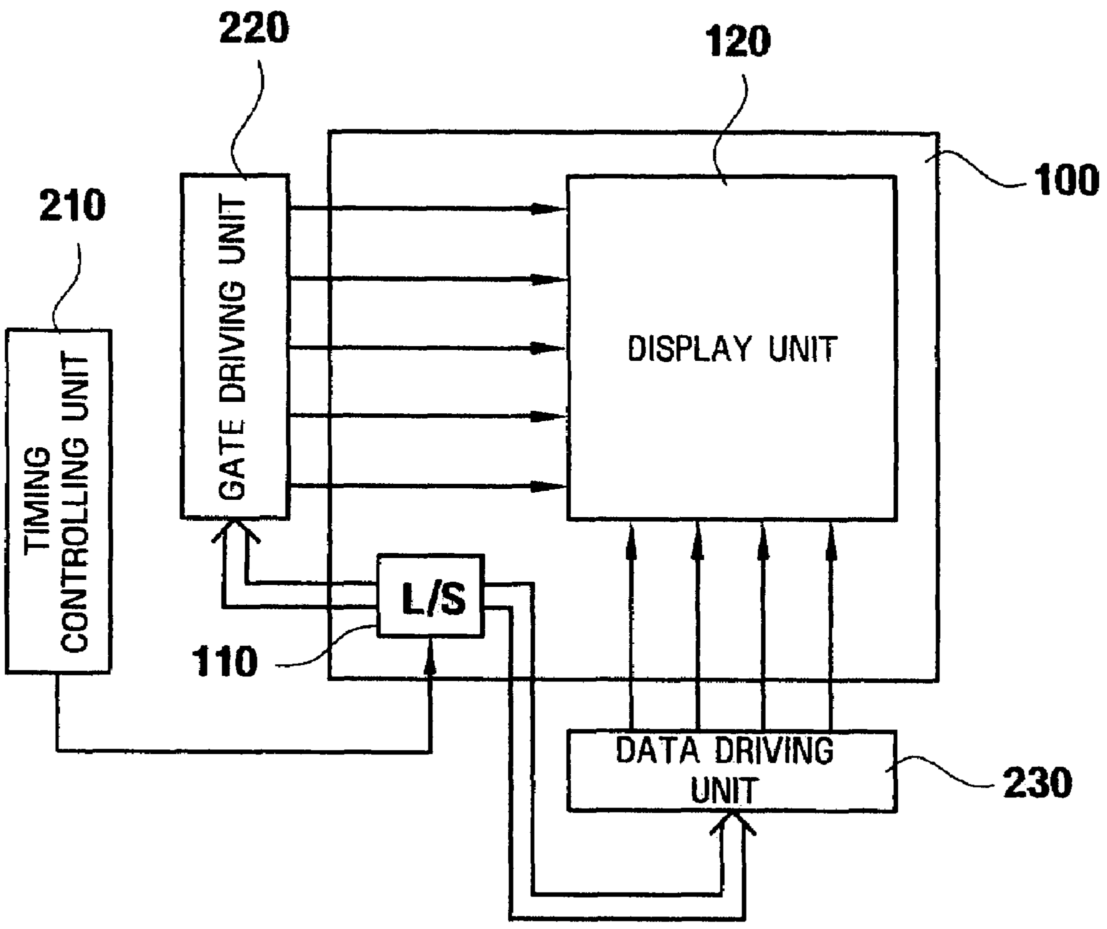
FIG. 2 is a block diagram of an LCD device according to an exemplary embodiment of the present invention.

FIG. 2 is a block diagram of an exemplary embodiment of a liquid crystal display ("LCD") device. The LCD device of FIG. 2 includes a liquid crystal panel 100 and a timing control unit 210.

A single input level shifter 110 and a display unit 120 are formed in the liquid crystal panel 100. A gate driving unit 220 and a data driving unit 230 are mounted on the liquid crystal panel 100 using a chip on glass ("COG") technique, but the present invention is not limited to such a technique. The invention can also be applied to an LCD device in which the gate driving unit 220 or the data driving unit 230 is mounted on a PCB, a flexible film, or the like.

The display unit 120 includes a plurality of gate lines that transmit a scan signal, a plurality of data lines that transmit a gray-scale voltage in response to an image data signal and that are isolated from the plurality of gate lines, wherein the gate lines and the data lines cross each other, and a plurality of pixels that are arranged in a matrix having switching elements connected between the plurality of gate lines and the plurality of data lines.

The gate driving unit 220 provides the scan signal to the gate lines, the data driving unit 230 provides the gray-scale voltage to the data lines, the timing control unit 210 provides a logic signal, and the single input level shifter 110 level-shifts the logic signal and transmits it to the gate driving unit 220 or the data driving unit 230. The logic signal includes all digital signals for driving the gate driving unit 220 or the data driving unit 230 as well as a clock signal and a start signal.

Figure 3:
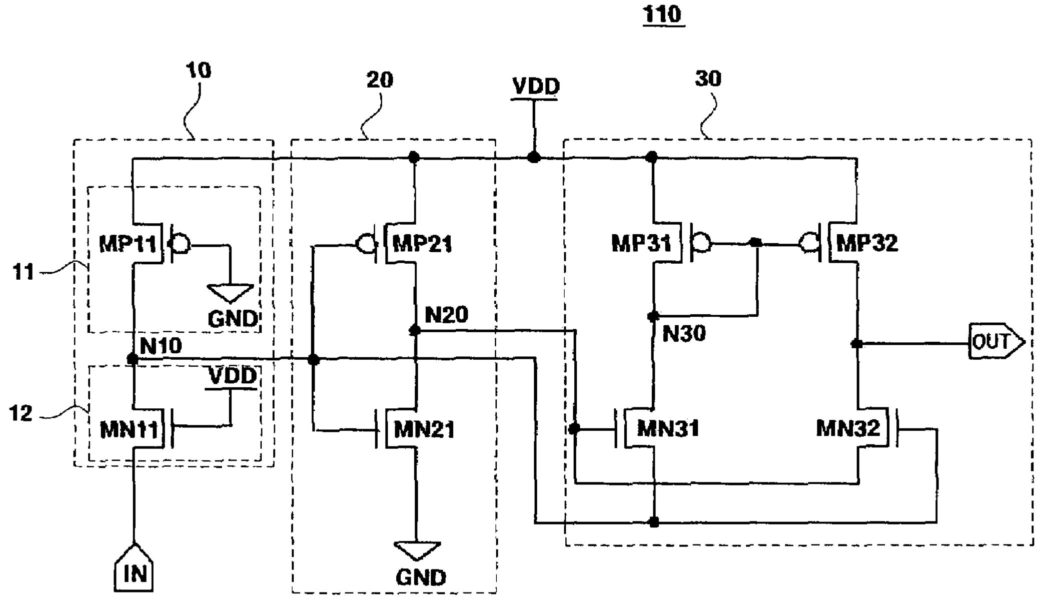
FIG. 3 is a circuit diagram of a single input level shifter for an LCD device according to another exemplary embodiment of the present invention.

Another exemplary embodiment of the single input level shifter 110 for the LCD device will now be described with reference to FIG. 3. FIG. 3 is a circuit diagram of an exemplary embodiment of the single input level shifter 110 for the LCD device. The single input level shifter 110 shown in FIG. 3 includes an intermediate voltage signal providing unit 10, an inverting unit 20, and a voltage signal comparing unit 30.

The intermediate voltage signal providing unit 10 provides a signal having a voltage that is intermediate of the supply voltage VDD and the input signal IN, the inverting unit 20 receives the intermediate voltage signal and produces an inverted intermediate voltage signal, and the voltage signal comparing unit 30 compares the inverted intermediate voltage signal from the inverting unit 20 to the intermediate voltage signal from the intermediate voltage signal providing unit 10 and provides the supply voltage VDD or a ground voltage GND according to the comparison result.

The intermediate voltage signal providing unit 10 includes a first current source 11 that transmits a predetermined current, such as a first current, to an output node N10, and a second current source 12 that transmits a predetermined current, such as a second current, to an input terminal IN, located in an area indicated by the input signal IN. The voltage of the intermediate voltage signal outputted to the output node N10 is determined by the ratio of the first current transmitted by the first current source 11 to the second current transmitted by the second current source 12.

That is, when the amount of current transmitted by the second current source 12 to the input terminal IN is larger than the amount of current transmitted by the first current source 11 to the output node N10, since more charge is discharged into the input terminal IN than is transmitted to the output node N10, the intermediate voltage signal outputted to the output node N10 decreases to less than half of the voltage difference between the supply voltage VDD and the input signal IN.

Conversely, when the amount of current transmitted by the second current source 12 to the input terminal IN is smaller than the amount of current transmitted by the first current source 11 to the output node N10, since less charge is discharged into the input terminal IN than is transmitted to the output node N10, the intermediate voltage signal outputted to the output node N10 increases to larger than half of the voltage difference between the supply voltage VDD and the input signal IN.

The first current source 11 may be a PMOS transistor MP11. The source of the PMOS transistor MP11 is connected to a terminal of the supply voltage VDD, its drain is connected to the output node N10 of the intermediate voltage signal providing unit 10, and its gate is connected to ground GND.

Since the gate of the PMOS transistor MP11 is connected to ground GND, the terminal of the supply voltage VDD is connected to the source of the PMOS transistor MP11, and the supply voltage VDD is transmitted to the source of the PMOS transistor MP11, the PMOS transistor MP11 is always turned on. Thus, the PMOS transistor MP11 may be used as a current source that transmits a predetermined current, such as a first current, to the output node N1. The amount of current provided by the PMOS transistor MP11 can be adjusted by the ratio of width W to length L W/L of the PMOS transistor MP11 and the difference between the supply voltage VDD and the voltage of the output node N11.

The second current source 12 may be an NMOS transistor MN11. The drain of the NMOS transistor MN11 is connected to the output node N10, its source is connected to the input terminal IN, and its gate is connected to the terminal of the supply voltage VDD.

Since the terminal of the supply voltage VDD is connected to the gate of the NMOS transistor MN11, the supply voltage VDD is transmitted to the gate of the NMOS transistor MN11, and since the output node N10 is connected to the drain of the NMOS transistor MN11 and the voltage of the output node N10 is transmitted to the drain of the NMOS transistor MN11, the NMOS transistor MN11 is always turned on. Thus, the NMOS transistor MN11 may be used as a current source that transmits a predetermined current, such as a second current, to the input terminal IN. The amount of current provided by the NMOS transistor MN11 can be adjusted by the width W to length L ratio W/L of the NMOS transistor MN11 and the difference between the voltage of the output node N10 and the voltage of the input signal IN.

When the input signal IN is low, the difference between the voltage of the output node N10 and the voltage of the input signal IN is larger than a difference between the voltage of the output node N10 and the voltage of the input signal IN when the input signal IN is high. Thus, more current reaches the input terminal IN when the input signal IN is low, and the voltage of the output node N10 is larger when the input signal IN is low than when the input signal IN is high.

Thus, the intermediate voltage signal providing unit 10 provides a voltage signal containing a predetermined direct current ("DC") voltage component with the difference between the high-level and low-level voltages of the input signal IN as the intermediate voltage signal. The high-level voltage is smaller than the supply voltage VDD, and the low-level voltage is larger than the ground voltage GND. The size of the predetermined DC voltage component can be adjusted by the width to length ratio W/L of the PMOS transistor MP11 and the width to length ratio W/L of the NMOS transistor MN11.

The PMOS transistor MP11 and the NMOS transistor MN11 may be formed of low temperature polysilicon ("LTPS"). Amorphous silicon is irradiated with a laser, thereby crystallizing to form the LTPS. The field effect mobility of LTPS is much higher than that of amorphous silicon, and it is easy to integrate the LTPS into the liquid crystal panel 100. As such, a smaller and thinner liquid crystal panel can be achieved and manufacturing costs can be reduced.

If the intermediate voltage signal providing unit 10 were formed using two resistors, instead of the illustrated transistors, since the difference between the high-level and low-level voltages of the input signal IN is reduced by the ratio of the two resistors, the intermediate voltage signal would not be appropriate for the inverting unit 20.

For example, when the difference between the high-level and low-level voltages of the input signal IN is 3V, if the intermediate voltage signal providing unit 10 is formed of two resistors having the same resistance, half of the difference between the supply voltage VDD and the high-level voltage of the input signal IN becomes an intermediate voltage signal at a high level and half of the difference between the supply voltage VDD and the low-level voltage of the input signal IN becomes an intermediate voltage signal at a low level. As a result, the difference between the high-level and low-level voltages of the intermediate voltage signal is reduced by 1.5V.

With further reference to FIG. 3, the intermediate voltage signal from the intermediate voltage signal providing unit 10 is transmitted to the inverting unit 20, and the inverting unit 20 produces an inverted intermediate voltage signal. The inverting unit 20 may connect a complementary MOS ("CMOS") transistor having a PMOS transistor MP21 and an NMOS transistor MN21 between the supply voltage VDD and the ground GND. When an NMOS and a PMOS transistor are wired together in a complementary fashion, they become a CMOS gate, which causes no power to be used until the transistors switch.

When a low-level intermediate voltage signal from the intermediate voltage signal providing unit 10 is transmitted to the inverting unit 20, the PMOS transistor MP21 is turned on and the supply voltage VDD is transmitted to an output node N20 of the inverting unit 20. When a high-level intermediate voltage signal from the intermediate voltage signal providing unit 10 is transmitted to the inverting unit 20, the NMOS transistor MN21 is turned on and the ground voltage GND is transmitted to the output node N20 of the inverting unit 20 and the NMOS transistor MN21 provides an inverted intermediate voltage signal.

In this case, the voltage of the high-level intermediate voltage signal is larger than the voltage of the high-level input signal IN so that a threshold voltage or subthreshold swing of the NMOS transistor MN21 is high and even though the field effect mobility 11 is low, the NMOS transistor MN21 is sufficiently turned on. That is, even when a threshold voltage is larger than a voltage of an input signal IN, a voltage of the intermediate voltage signal may be larger than the threshold voltage for sufficiently turning the NMOS transistor ON.

Thus, even when the voltage of the high-level input signal IN is reduced, the NMOS transistor MN21 can be sufficiently turned on and thus, an inverted intermediate voltage signal can be provided to the output node N20. In addition, even if deviation exists in the threshold voltage, the NMOS transistor MN21 and the PMOS transistor MP21 can be sufficiently turned on.

The difference between the high-level and low-level voltages of the intermediate voltage signal is larger than the difference between the high-level and low-level voltages of the input signal IN. The low-level voltage of the intermediate voltage signal is larger than ground GND and, when the low-level intermediate voltage signal is input to the inverting unit 20, the NMOS transistor MN21 is not securely turned off so the high-level voltage of the intermediate voltage signal is less than the supply voltage VDD.

The PMOS transistor MP21 and the NMOS transistor MN21 may also be formed of LTPS. The amorphous silicon is irradiated with a laser, thereby crystallizing to form the LTPS. The field effect mobility of the LTPS is much higher than that of amorphous silicon, and it is easy to integrate and form the LTPS on the liquid crystal panel 100. As such, manufacturing costs are reduced and a small and thin LCD can be achieved.

The intermediate voltage signal from the intermediate voltage signal providing unit 10 and the inverted intermediate voltage signal from the inverting unit 20 are transmitted to the voltage signal comparing unit 30, and the voltage signal comparing unit 30 produces an output signal OUT at the supply voltage VDD or ground GND from the single input level shifter 110. The voltage signal comparing unit 30 includes a current mirror and two NMOS transistors MN31 and MN32, as also shown in FIG. 3.

The current mirror includes a PMOS transistor MP31, which is connected to the supply voltage VDD and a common node N30 and whose gate and drain are commonly connected to each other, and a PMOS transistor MP32 which is connected between the supply voltage VDD and the output terminal OUT and whose gate is connected to the gate of the PMOS transistor MP31. Thus, the gate of the PMOS transistor MP31 is connected to both the drain of the PMOS transistor MP31, which is the common node N30, and to the gate of the PMOS transistor MP32.

The NMOS transistor MN31 is connected to the common node N30 and the output node N10 of the intermediate voltage signal providing unit 10, and a gate of the NMOS transistor MN31 is connected to the output node N20 of the inverting unit 20. The NMOS transistor MN32 is connected to the output terminal OUT and the output node N20, and a gate of the NMOS transistor MN32 is connected to the output node N10.

Since the voltage signal comparing unit 30 is not required to amplify the difference between an output signal of the inverting unit 20 applied to the gate of the NMOS transistor MN31 and the intermediate voltage signal of the intermediate voltage signal providing unit 10 applied to the gate of the NMOS transistor MN32, an NMOS transistor, which serves as a current sink in the conventional differential amplifier, is not required. The conventional differential amplifier comprises two PMOS transistors and three NMOS transistors. However, the voltage signal comparing unit 30 includes two PMOS transistors MP31 and MP32 and two NMOS transistors MN31 and MN32. Thus, the area of the voltage signal comparing unit 30 can be effectively reduced as compared to a level shifter that must include a differential amplifier.

When the low-level input signal IN is applied to the input terminal IN, the intermediate voltage signal providing unit 10 provides the low-level intermediate voltage signal to the inverting unit 20, and thus, the inverted intermediate voltage signal produced by the inverting unit 20 is high. Thus, the high inverted intermediate voltage signal from the inverting unit 20 via output node N20 is provided to the gate of the NMOS transistor MN31 and the low-level intermediate voltage signal from the intermediate voltage signal providing unit 10 via the output node N10 is transmitted to the gate of the NMOS transistor MN32 and thus, only the NMOS transistor MN31 is turned on when the low-level input signal IN is applied. When the NMOS transistor MN31 is turned on, the common node N30 is low and the PMOS transistor MP32 is turned on for transmitting the supply voltage VDD to the output terminal OUT.

In particular, since the high-level inverted intermediate voltage signal from output node N20 is transmitted to the gate of the NMOS transistor MN31, the voltage of the common node N30 is reduced by the low-level intermediate voltage signal. Thus, the PMOS transistor MP32 is securely turned on and the supply voltage VDD is transmitted to the output terminal OUT.

When the high-level input signal IN is applied to the input terminal IN, the intermediate voltage signal providing unit 10 provides the high-level intermediate voltage signal to the inverting unit 20 and thus, the inverting unit 20 produces a low-level inverted intermediate voltage signal. Thus, the low-level inverted intermediate voltage signal from the inverting unit 20 via the output node N20 is transmitted to the gate of the NMOS transistor MN31 and the high-level intermediate voltage signal from the intermediate voltage signal providing unit 10 via the output node N10 is transmitted to the gate of the NMOS transistor MN32 so that only the NMOS transistor MN32 is turned on. When the NMOS transistor MN32 is turned on, the low-level inverted intermediate voltage signal is transmitted to the output terminal OUT. Thus, the output terminal OUT is grounded.

Consequently, when the low-level input signal IN is applied to the voltage signal comparing unit 30, the voltage signal comparing unit 30 provides the supply voltage VDD as the output signal OUT, and when the high-level input signal IN is applied to the voltage signal comparing unit 30, the voltage signal comparing unit 30 provides the ground voltage GND as the output signal OUT.

The PMOS transistors MP31 and MP32 and the NMOS transistors MN31 and MN32 may also be formed of LTPS. As described above, amorphous silicon is irradiated by a laser, thereby crystallizing to form LTPS. The field effect mobility of the LTPS is much higher than that of amorphous silicon, and it is easy to integrate and form the LTPS on the liquid crystal panel 100. As such, manufacturing costs are reduced and a small and thin LCD can be achieved.

Since the level shifter 110 with a single input according to the present invention does not require a separate inverted input signal IN, an interconnection for transmitting the inverted input signal IN is not required and the area of the level shifter 110 and the number of output terminals of the timing control unit 210 is not increased. In addition, since a separate reference voltage is not required, malfunctions that may occur when coupling an interconnection for transmitting a reference voltage with an interconnection for transmitting other voltage signals do not occur.

Figure 4A:
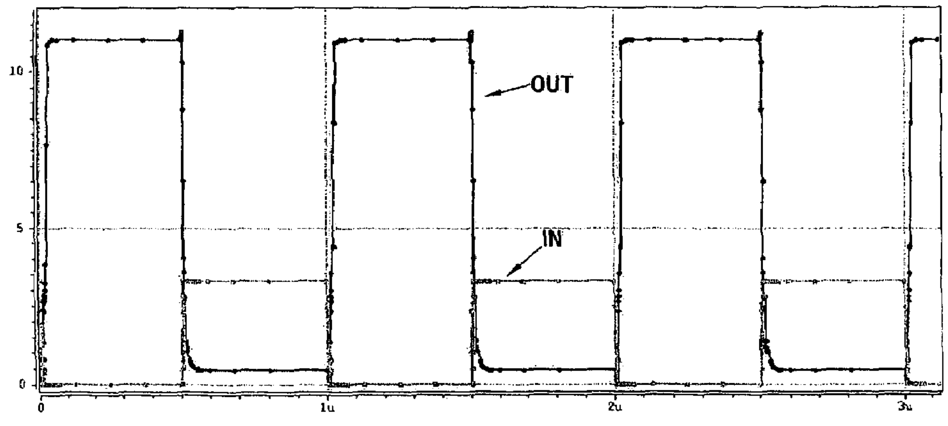
FIGS. 4A and 4B are waveform diagrams illustrating signals of a main unit of the single input level shifter shown in FIG. 3.
Figure 4B:
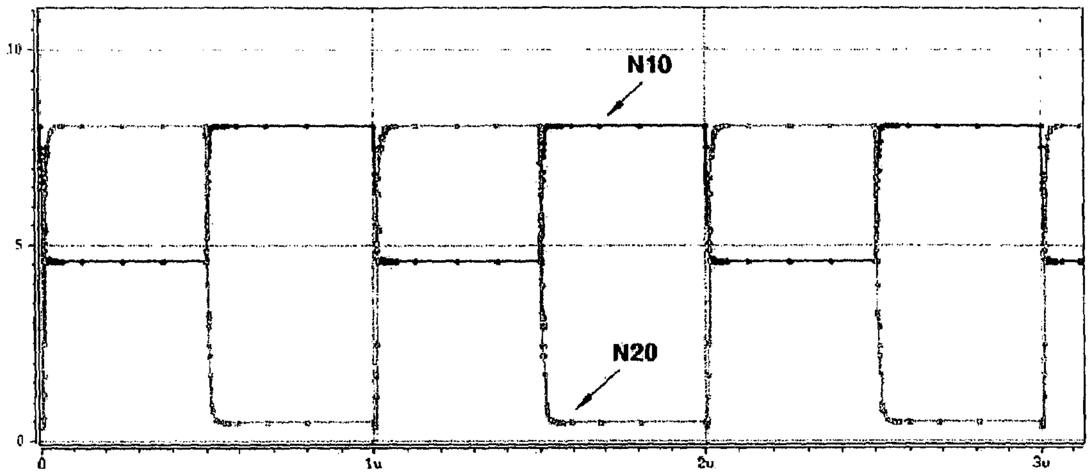

FIGS. 4A and 4B are exemplary waveform diagrams illustrating signals of a main unit of the single input level shifter 110 shown in FIG. 3. FIGS. 4A and 4B were attained by performing a simulation on the single input level shifter 110 of FIG. 3 using a circuit simulator known as SPICE (Simulation Program for Integrated Circuits Emphasis). SPICE is a circuit simulator, developed at the University of California, Berkeley, and used to verify circuit designs and to predict circuit behavior. The illustrated waveform diagrams provide for a case where the supply voltage VDD is 12 V, the ground voltage GND is 0 V, and the input signal IN is a 0-3.3 V pulse, however, it should be understood that alternate voltage values would be within the scope of these embodiments, and that these entries are for demonstration purposes only.

When the input signal IN is applied as shown in FIG. 4A, the intermediate voltage signal providing unit 10 provides a 4.5-8V uninverted pulse as an intermediate voltage signal N10, the inverting unit 20 provides a 0.5-8V inverted pulse, as an inverted intermediate voltage signal N20, as shown in FIG. 4B, and the voltage signal comparing unit 30 provides a inverted 0.5-11.5V pulse as an output signal OUT, as shown in FIG. 4A.

As described above, the present invention provides a single input level shifter that is formed of thin film transistors ("TFTs"), and that can perform a stable level-shifting operation without increasing its area even when its threshold voltage varies, and a liquid crystal display ("LCD") device using the same. While the present invention has been particularly shown and described with reference to exemplary embodiments thereof, it will be understood by those skilled in the art that various changes in form and details may be made therein without departing from the spirit and scope of the invention as defined by the following claims and equivalents thereof. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A single input level shifter comprising:

an intermediate voltage signal providing unit which provides an intermediate voltage signal having a voltage between a supply voltage and an input signal voltage;

an inverting unit which receives the intermediate voltage signal and provides an inverted intermediate voltage signal; and a voltage signal comparing unit which compares the intermediate voltage signal with the inverted intermediate voltage signal and provides the supply voltage or ground voltage according to comparison between the intermediate voltage signal and the inverted intermediate voltage signal, wherein the voltage signal comparing unit comprises:

a first PMOS transistor having a gate and a drain connected to the gate;

a second PMOS transistor having a gate connected to the gate of the first PMOS transistor;

a first NMOS transistor connected between the drain of the first PMOS transistor and an output node of the intermediate voltage signal providing unit and further having a gate connected to an output node of the inverting unit; and a second NMOS transistor connected between the drain of the second PMOS transistor and the output node of the inverting unit and further having a gate connected to the output node of the intermediate voltage signal providing unit.

2. The single input level shifter of claim 1, wherein the intermediate voltage signal providing unit includes a first current source for transmitting a first current to an output node, and a second current source for transmitting a second current to an input terminal, and voltage of the intermediate voltage signal is adjusted by a ratio of the first current transmitted by the first current source to the second current transmitted by the second current source.

3. The single input level shifter of claim 2, wherein the first current source is a PMOS transistor having a source connected to a terminal of the supply voltage, a drain connected to the output node of the intermediate voltage signal providing unit, and a gate connected to ground.

4. The single input level shifter of claim 3, wherein the PMOS transistor is formed of polysilicon.

5. The single input level shifter of claim 2, wherein the second current source is an NMOS transistor having a drain connected to the output node of the intermediate voltage signal providing unit, a source connected to the input terminal, and a gate connected to a supply voltage terminal.

6. The single input level shifter of claim 5, wherein the NMOS transistor is formed of polysilicon.

7. A single input level shifter comprising:

an intermediate voltage signal providing unit which provides an intermediate voltage signal to an inverting unit, the intermediate voltage signal including one of a first intermediate voltage signal corresponding to a first input signal and a second intermediate voltage signal corresponding to a second input signal, a voltage of the first intermediate voltage signal larger than a voltage of the second intermediate voltage signal, and the voltage of the first intermediate voltage signal larger than a voltage of the first input signal; and a voltage signal comparing unit which comprises:

a first PMOS transistor having a gate and a drain connected to the gate;

a second PMOS transistor having a gate connected to the gate of the first PMOS transistor;

a first NMOS transistor connected between the drain of the first PMOS transistor and an output node of the intermediate voltage signal providing unit and further having a gate connected to an output node of the inverting unit; and a second NMOS transistor connected between the drain of the second PMOS transistor and the output node of the inverting unit and further having a gate connected to the output node of the intermediate voltage signal providing unit.

8. The single input level shifter of claim 7, wherein a difference between the voltage of the first intermediate voltage signal and the voltage of the second intermediate voltage signal is larger than a difference between the voltage of the first input signal and a voltage of the second input signal.

9. The single input level shifter of claim 7, wherein the voltage of the second intermediate voltage signal is larger than ground and wherein the voltage of the first intermediate voltage signal is smaller than a supply voltage.

10. The single input level shifter of claim 7, further comprising a voltage signal comparing unit which compares voltage of the intermediate voltage signal to an inverted intermediate voltage signals the voltage signal comparing unit not including a differential amplifier.

11. A single input level shifter comprising:

an intermediate voltage signal providing unit which provides an intermediate voltage signal;

an inverting unit including an NMOS transistor having a threshold voltage, and when the threshold voltage is larger than a voltage of an input signal but smaller than a voltage of the intermediate voltage signal, the NMOS transistor is turned on; and a voltage signal comparing unit which comprises:

a first PMOS transistor having a gate and a drain connected to the gate;

a second PMOS transistor having a gate connected to the gate of the first PMOS transistor;

a first NMOS transistor connected between the drain of the first PMOS transistor and an output node of the intermediate voltage signal providing unit and further having a gate connected to an output node of the inverting unit; and a second NMOS transistor connected between the drain of the second PMOS transistor and the output node of the inverting unit and further having a gate connected to the output node of the intermediate voltage signal providing unit.

* * * * *